US010224113B2

(12) United States Patent
Hidri

(10) Patent No.: US 10,224,113 B2
(45) Date of Patent: Mar. 5, 2019

(54) SAMPLING DEVICE

(71) Applicant: Rohde & Schwarz GmbH & Co. KG, Munich (DE)

(72) Inventor: Ols Hidri, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 130 days.

(21) Appl. No.: 15/173,348

(22) Filed: Jun. 3, 2016

(65) Prior Publication Data

US 2017/0098475 A1 Apr. 6, 2017

(30) Foreign Application Priority Data

Oct. 1, 2015 (EP) .................................... 15187933

(51) Int. Cl.
*G11C 27/02* (2006.01)
*H03K 5/24* (2006.01)
*H03M 1/12* (2006.01)

(52) U.S. Cl.
CPC ............ *G11C 27/02* (2013.01); *G11C 27/024* (2013.01); *H03K 5/249* (2013.01); *H03K 5/2418* (2013.01); *H03K 5/2427* (2013.01); *H03K 5/2481* (2013.01); *H03M 1/124* (2013.01)

(58) Field of Classification Search
CPC ...................................................... G11C 27/02
See application file for complete search history.

(56) References Cited

U.S. PATENT DOCUMENTS

| 5,134,403 A | 7/1992 | Rush |
| 5,510,735 A | 4/1996 | Van De Plassche |
| 7,136,000 B1 * | 11/2006 | Hidri .................... G11C 27/024 341/122 |
| 8,111,091 B2 * | 2/2012 | Glass ................... G11C 27/026 327/96 |
| 8,179,165 B2 * | 5/2012 | Le .......................... H03K 5/131 327/271 |
| 2004/0130356 A1 | 7/2004 | Higashi et al. |

OTHER PUBLICATIONS

Carley, et al., "High-speed Low-Power Integrating CMOS Sample-and-Hold Amplifier Architecture", IEEE 1995 Custom Integrated Circuits Conference, 0-7803-2584-2/95, 1995.
EPO, "Extended European Search Report", EP15187933.5, dated Apr. 4, 2016.

* cited by examiner

*Primary Examiner* — Hai L Nguyen
(74) *Attorney, Agent, or Firm* — Potomac Technology Law, LLC

(57) ABSTRACT

A sampling device samples a differential measuring voltage. The sampling device comprises a first holding device, a second holding device and a multiplexing circuit, which is configured to provide a differential sample of a sampled differential signal, derived from the differential measuring voltage by sampling with a first clock signal of a first clock rate, to the first holding device, at the occurrence of each HIGH-value of a second clock signal of a second clock rate being half of the first clock rate and provide a differential sample of the sample differential signal to the second holding device, at each LOW-value of the second clock signal. The sampling device comprises a reset device configured to reset the second holding device at or after each HIGH-value of the second clock signal and reset the first holding device at or after each LOW-value of the second clock signal.

20 Claims, 13 Drawing Sheets

SAMPLING DEVICE

RELATED APPLICATIONS

This application claims priority of European patent application EP 15 187 933.5, filed 2015 Oct. 1, which is incorporated herein by reference in its entirety.

FIELD

The invention relates to a sampling device, such as a sampling device for use in an analog-digital-converter (ADC).

BACKGROUND

The sample and hold circuit is a primary element in an analog to digital conversion system. The sample and hold circuit captures the analog value of an electrical quantity (e.g., a voltage, current, charge, etc.) and holds it constant in a memory element for a desired amount of time. Usually the memory element is a capacitor, which stores the captured analog value. Holding the value constant provides time for the supporting circuitry to digitize the analog value.

The sample and hold speed defines the portion of the analog input signal spectrum that can be converted without aliasing errors. Hence, high sampling speeds, combined with intrinsic analog bandwidth and linearity, are defining parameters of sample and hold circuits.

Moreover, the hold-time of the memory element in the sample and hold circuit is also important. The longer the hold-time, the more accurately the supporting circuitry can measure the respective value.

For example, U.S. Pat. No. 5,134,403 shows a current mode sampling circuit, which offers sub-optimal sampling speed.

What is, therefore, needed is a sampling device that provides a high sampling speed and a long hold-time.

SUMMARY OF THE INVENTION

Example embodiments of the present invention advantageously address the foregoing requirements and needs, as well as others, by providing approaches for a sampling function that provides for improved sampling speeds and hold-times.

In accordance with example embodiments, a sampling device serves the purpose of sampling a differential measuring voltage.

According to one embodiment, the sampling device comprises at least a first holding device, a second holding device and a demultiplexing circuit. By way of example, the demultiplexing circuit is configured to provide a differential sample of a sampled differential signal derived from the differential measuring voltage by sampling with a first clock signal of a first clock rate, to the first holding device, at the occurrence of each first value, for example HIGH-value, of a second clock signal of a second clock rate being half of the first clock rate. Further, the sampling device comprises a reset device configured to reset the second holding device at or after the occurrence of each first value, for example HIGH-value, of the second clock signal. Thereby, a high sampling speed and a long holding time are achieved. Moreover, the sampling circuit only has a low hardware effort. By way of further example, the demultiplexing circuit is further configured to provide a differential sample of the sampled differential signal to the second holding device, at the occurrence of each second value, for example LOW-value, of the second clock signal. By way of further example, the reset device is further configured to reset the first holding device at or after the occurrence of each second value, for example LOW-value, of the second clock signal.

According to a further embodiment, the sampling device comprises a voltage-current-converter comprising a current source, a first conversion transistor connected to the current source and a second conversion transistor connected to the current source. The differential measuring voltage is connected to control inputs of the first conversion transistor and the second conversion transistor. By way of example, the voltage-current-converter is configured to convert the differential measuring voltage into a differential measuring current. By way of further example, the first conversion transistor and the second conversion transistor are configured to provide the differential measuring current to the sampling circuit. An accurate conversion of the measuring voltage into a measuring current is thereby achieved. Especially, a low hardware effort is reached.

According to a further embodiment, the sampling device comprises a sampling circuit. By way of example, the sampling circuit is configured to sample the differential measuring current during first pulses, especially HIGH-pulses, of a first clock signal, thereby generating a sampled differential signal comprising a differential signal sample for each pulse of the first clock signal, the first clock signal having a first clock rate.

According to a further embodiment, the sampling circuit comprises a first sampling transistor and a second sampling transistor, each connected to the voltage-current-converter and to the demultiplexing circuit. Control inputs of the first sampling transistor and the second sampling transistor are connected to the first clock signal. By way of example, the first sampling transistor and the second sampling transistor are configured to conduct the differential measuring current during first pulses, especially HIGH-pulses, of the first clock signal and not conduct the differential measuring current during second pulses, especially LOW-pulses, of the first clock signal, thereby generating the sampled differential signal. Thereby, with a low hardware effort, the sampled differential signal is generated.

According to a further embodiment, the demultiplexing circuit comprises a first demultiplexing path and a second demultiplexing path. By way of example, the first demultiplexing path is configured to provide the differential sample of the sampled differential signal to the first holding device after the occurrence of each HIGH-value of the second clock signal, and the second demultiplexing path is configured to provide the differential sample of the sampled differential signal to the second holding device, at the occurrence of each second value, especially LOW-value, of the second clock signal. Thereby, it is possible to double the hold-time with a low hardware effort.

According to a further embodiment, the first demultiplexing path comprises a first demultiplexing transistor and a second demultiplexing transistor, connected to the sampling circuit and to the first holding device. The second demultiplexing path then comprises a third demultiplexing transistor and a fourth demultiplexing transistor, connected to the sampling circuit and to the second holding device. The second clock signal is connected to control inputs of the third demultiplexing transistor and the fourth demultiplexing transistor. An inverse of the second clock signal is connected to control inputs of the first demultiplexing transistor and the second demultiplexing transistor. By way of example, the first demultiplexing transistor and the second demultiplexing transistor are configured to provide the sample differential signal to the first holding device during each first value, especially HIGH-value, of the second clock signal. By way of further example, the third demultiplexing transistor and the fourth demultiplexing transistor are configured to provide the sample differential signal to the second holding device during each first value, especially HIGH-value, of the inverse second clock signal, which corresponds to each second value, especially LOW-value, of the second clock signal. It is thereby assured, that with a very low hardware effort, every other sampled value is handed to the first and the second holding device.

According to a further embodiment, the first holding device comprises a first holding capacitor and a second holding capacitor, and the second holding device comprises a third holding capacitor and a fourth holding capacitor. By way of example, the first and second holding capacitors are configured to hold the differential samples of the sampled differential signal, and the third and fourth holding capacitors are configured to hold the differential samples of the sampled differential signal. An especially accurate sampling of the differential signals is thereby achieved.

According to a further embodiment, the sampling device comprises a dump circuit. By way of example, the sampling circuit is configured to dump the differential measuring current to the dump circuit during low-periods of the first clock signal. Thereby it is achieved that the differential measuring current constantly flows. An especially high accuracy of the sampling can thereby be reached. By way of further example, the dump circuit is configured to provide a first reset signal to the reset device triggering the reset of the first holding device and to provide a second reset signal to the reset device, triggering the reset of the second holding device. By generating the first and second reset signals by the dump circuit, an especially low hardware-effort is achieved. By way of further example, the dump circuit is configured to provide the first reset signal to the reset device with a delay with respect to a triggering clock pulse and to provide the second reset signal to the reset device with a delay with respect to a triggering clock pulse. It is thereby achieved that the hold-time of the holding circuits is increased without significant additional hardware effort.

According to a further embodiment, the dump circuit comprises a first dump transistor and a second dump transistor connected to the sampling circuit. By way of example, the first and second dump transistors are configured to receive the measuring current during the low-periods of the first clock signal, wherein outputs of the first dump transistor and the second dump transistor are combined to a dump path. The dump circuit may further comprise a first resistor and a second resistor, both connected to a first potential, especially HIGH potential, each by a first terminal, and a first reset signal generating transistor connected to the dump path and to a second terminal of the first transistor and a second reset signal generating transistor connected to the dump path and to a second terminal of the second transistor. The second terminal of the first resistor and the second resistor are connected to the reset device. By way of example, the second terminal of the first resistor is configured to provide the first reset signal to the reset device and the second terminal of the second resistor is configured to provide the second reset signal to the reset device. Thereby, an especially low hardware effort for generating the reset signals is achieved.

According to a further embodiment, the sampling device further comprises a clock signal generator, a third dump transistor connected in parallel to the first dump transistor, and a fourth dump transistor connected in parallel to the second dump transistor. Output signals of the third dump transistor and the fourth dump transistor are combined to a clock generating signal. By way of example, the clock signal generator is configured to generate the first clock signal and the second clock signal. By way of further example, the clock generating signal is provided to the clock signal generator, and the clock signal generator is configured to generate the second clock signal from the clock generating signal. Generating the second clock signal from a signal derived from the dump circuit is advantageous, since the first clock signal has to be extremely accurate. Directly deriving the second clock signal from the first clock signal might negatively affect the first clock signal. The signal in the dump circuit though does not have to be extremely accurate. Therefore, a slight alteration of the signal in the dump circuit by generating the second clock signal therefrom is unproblematic.

According to a further embodiment, the dump circuit comprises a stabilizing current source, a first stabilizing transistor connected between the stabilizing current source and the second terminal of the first resistor, and a second stabilizing transistor connected between the stabilizing current source and the second terminal of the second resistor. By way of example, the first stabilizing transistor is configured to keep a voltage at the second terminal of the first resistor low, while a current flows through the second resistor. By way of further example, the second stabilizing transistor is configured to keep a voltage at the second terminal of the second resistor low, while a current flows through the first resistor. An especially stable and efficient function of the sampling device is thereby achieved.

According to a further embodiment, the reset device comprises a first reset circuit and a second reset circuit. By way of example, the first reset circuit is configured to reset the first holding device as a reaction to receiving a first reset signal, and the second reset circuit is configured to reset the second holding device as a reaction to receiving a second reset signal. An especially efficient and low-hardware effort reset of the holding devices is thereby achieved.

According to a further embodiment, the first reset circuit and the second reset circuit each comprise an emitter following circuit connected to the respective first or second reset signal, a dump path, a reset path, and a differential transistor pair. By way of example, (1) when activated, the emitter following circuit is configured to provide a voltage shift at first or second reset signal, the dump path is configured to dump a reset current, (2) when activated, the reset path is configured to provide a holding circuit reset signal to the respective first or second holding device, (3) the differential transistor pair is configured to activate the dump path while a second value, especially a LOW-value, of the voltage shifted first or second reset signal is present, and to activate the reset path while a first value, especially a HIGH-value, of the respective voltage shifted first or second reset signal is present. An especially accurate and low hardware effort reset is thereby possible.

According to a further embodiment, the emitter following circuit comprises a first emitter following transistor, a second emitter following transistor, and an emitter following current source. The first emitter following transistor is connected to a first potential, especially to HIGH potential, at a first terminal and to a first terminal of the second emitter following transistor, at a second terminal. A control input of the second emitter following transistor is connected to the first terminal of the second emitter following transistor. A second terminal of the second emitter following transistor is connected to the emitter following current source. A control input of the first emitter following transistor is connected to the respective first or second reset signal. By way of example, the second terminal of the second emitter following transistor is configured to provide the voltage shifted first or second reset signal. An especially low hardware effort of the reset circuit is thereby achieved.

According to a further embodiment, the first reset circuit and the second reset circuit each comprise a differential transistor pair comprising a first differential pair transistor and a second differential pair transistor, wherein a first terminal of the first differential pair transistor is connected to the dump path and wherein a first terminal of the second differential pair transistor is connected to the reset path. Further, each reset circuit comprises a reset current source, connected to second terminals of the first differential pair transistor and the second differential pair transistor. A control terminal of the first differential pair transistor is connected to a holding circuit reset signal. A control terminal of the second differential pair transistor is connected to the respective voltage shifted first or second reset signal. By way of example, the reset current source is configured to provide a reset current. By way of further example, the first differential pair transistor is configured to conduct the reset current, and thereby dump the reset current to the dump path, while a second value, especially a LOW-value, of the voltage shifted first or second reset signal is pressed at the control terminal of the second differential pair transistor. By way of further example, the second differential pair transistor is configured to conduct the reset current, and thereby activate the reset path to provide a holding circuit reset signal to the respective first or second holding device, while a first value, especially a HIGH-value of the voltage shifted first or second reset signal is present at the control terminal of the second differential pair transistor. An especially accurate generation of the holding circuit reset signal with an especially low hardware effort is thereby achieved.

According to a further embodiment, the dump path comprises a dump path resistor, a first dump path transistor and a second dump path transistor. The dump path resistor is connected to the first potential, especially HIGH potential, at a first terminal and to a first terminal of the first dump path transistor and a controlled input of the first dump path transistor, at a second terminal. A second terminal of the first dump path transistor is connected to a first terminal of the second dump path transistor and to a control input of the second dump path transistor. A second terminal of the second dump path transistor is connected to the differential transistor pair. By way of example, the first dump path transistor and second dump path transistor are configured to conduct the reset current, while the dump path is activated.

According to a further embodiment, the reset path comprises a first reset transistor, a second reset transistor and a third reset transistor and a fourth reset transistor. The first terminals of the first reset transistor and the second reset transistor are connected to the first potential, especially to HIGH potential. Control inputs of the first reset transistor and the second reset transistor are connected to the control inputs of the first dump path transistor. A second terminal of the first reset transistor is connected to a first terminal of the third reset transistor. A second terminal of the second reset transistor is connected to a first terminal of the fourth reset transistor. Control inputs of the third reset transistor and the fourth reset transistor are connected to the control input of the second dump path transistor. Second terminals of the third reset transistor and the fourth reset transistor are connected to the differential pair. By way of example, the first reset transistor, the second reset transistor, the third reset transistor and the fourth reset transistor are configured to conduct the reset current and thereby provide the holding circuit reset signal to the respective first or second holding device, while the reset path is activated. An especially accurate and low-hardware effort generation of the holding circuit reset signal is thereby achieved.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

Example embodiments of the present invention are illustrated by way of example only and not by way of any limitation in the figures of the accompanying drawings, in which like reference numerals refer to similar elements and/or functions, and in which.

DETAILED DESCRIPTION

Figure 1:
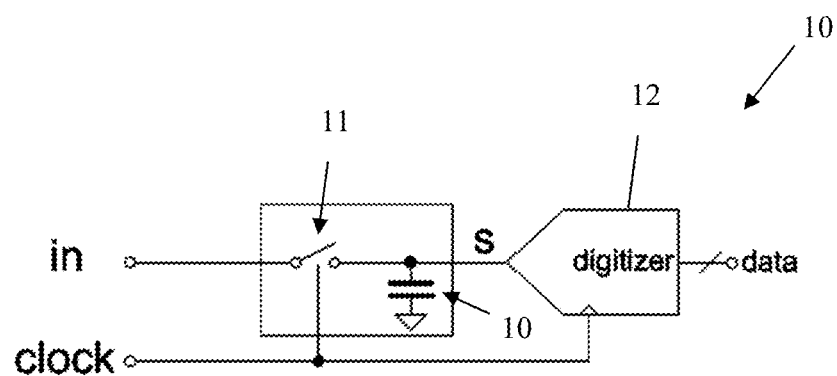
FIG. 1 shows a block diagram of an example prior art sample-hold-circuit.

The majority of current sampling circuits are embodied as track and hold circuits. FIG. 1 shows a block diagram of a typical prior art sample-hold-circuit. An input signal IN is connected to a switch 11, which is controlled by a clock signal. An output of the switch 11 is connected to a capacitor 10. The capacitor 10 again is connected to a digitizer 12.

The sampler operation comprises two phases. A first phase, during which the clock controlled switch 11 is conductive and the analog input voltage IN is being tracked by the terminals of the capacitor 10, and a second phase, during which the switch 11 is open and the voltage across the terminals of the capacitor 10 stays constant and equal to the value of the input signal IN at the moment, the switch 11 changes state, meaning on to off state. To capture the next analog value, the switch 11 changes state and becomes conductive again.

Before the analog voltage at the terminal of the capacitor 10 tracks the analog input signal again, the previous stored value has to be deleted. The track phase can be thought of as a phase during which two simultaneous operations take place, (1) resetting the previous value, and (2) reading the new value.

These two operations take place simultaneously. Performing these operations simultaneously demands a low impedance on both terminals of the switch 11. First, the impedance from node "s" towards node "in" needs to be low. This is necessary to let the old stored charge to flow back to the input node. It should be noted that this is the only possible path since the input of the digitizer is of high impedance. Second, the impedance from node "in" towards node "s" needs to be low in order to charge the capacitance to the new captured value with a certain desired bandwidth.

Furthermore, the sampler linearity depends on the ability of the switch 11 to let the capacitor 10 terminals follow the input signal IN during the track time without generation of harmonics. This depends on the switch 11 on-resistance. The on-resistance should stay constant during the track time. This requirement can be quite difficult to achieve for many reasons. For instance, the clock signal transient shape modulates the switch 11 on resistance. For example, in case of a MOS transistor used as a switch, the channel resistance depends on the voltage across gate to drain and gate to source terminals, which is clock to in and or clock to "s" node voltage difference. Also, the charge drift velocity saturation in the MOS channel is a source of nonlinearity. The switch 11 linearity performance can be improved usually by reducing its on resistance value (bigger MOS not always a possible solution) and by keeping the on-resistance constant and independent from the input signal level. These techniques might need extra circuitry such as constant-VGS-sampling MOS switch. However, such circuits do have their limitations, especially as the input signal frequency increases.

It should also be noted that the track time cannot be made arbitrarily small. The switch 11 resistance transition from full on to fully off needs a finite time. During this transition time, the switch 11 resistance value does not allow a proper capturing of the analog signal, hence it is seen as a non-ideal effect compared to the ideal switch, which has an ideal transition times of zero. As a result, part of the track period is not spent at optimum capture conditions. Hence, the track time cannot be made arbitrarily small, which means that the sampling period cannot be made arbitrarily small.

Figure 2:
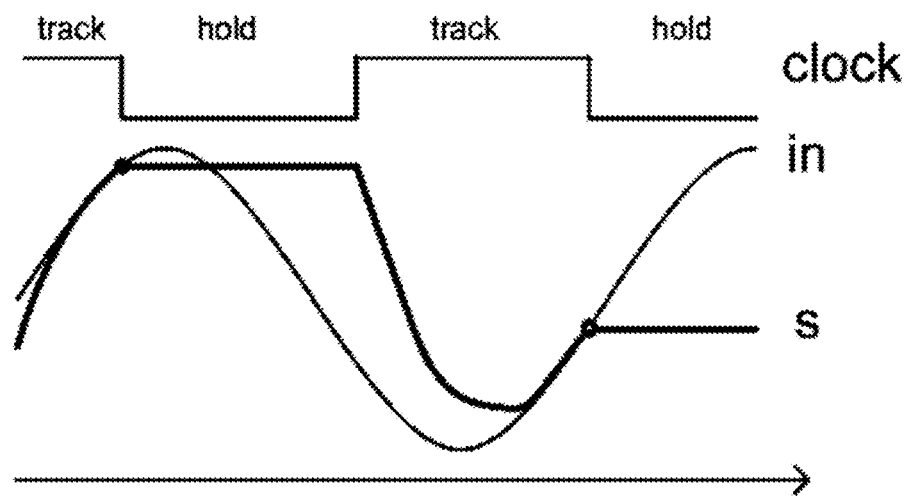
FIG. 2 shows signals of the sample-hold-circuit of FIG. 1.

FIG. 2 shows signals of the sample-hold-circuit of FIG. 1.

Further, an example sampler is possible, where after a voltage-to-current-conversion input stage, the current is sampled by an RC network. It should be noted that such a circuit does not have a typical track time as described above and the reset operation is shifted during the hold mode. The analog value captured on the capacitor terminals is reset by the use of a resistor in parallel during the second phase, which resembles a substitute hold phase. Hence, the sampled value is not held constant. This makes the operation of the following supporting circuitry more challenging compared to the case of held sampled value. Also, the signal to noise level of the RC network is worse compared to the case of the constant held value case, since the sampled signal amplitudes are lower for the RC network.

Figure 3:
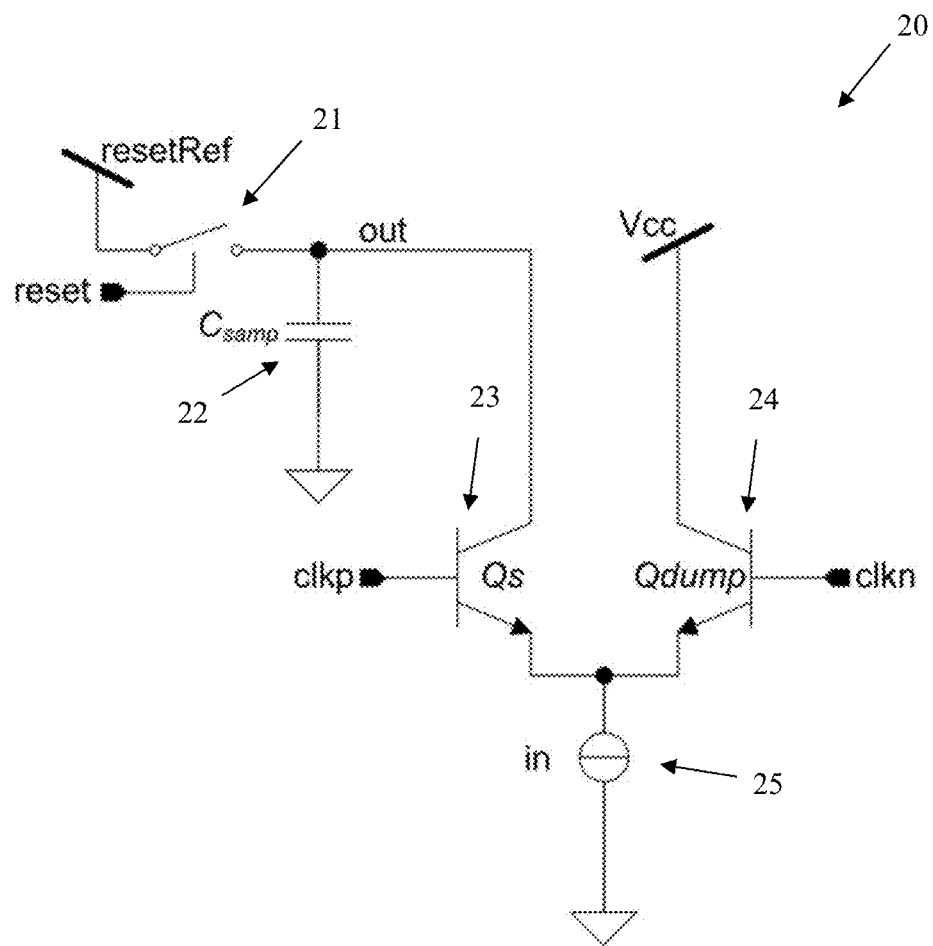
FIG. 3 shows a block diagram of a further example prior art sample-hold-circuit.

FIG. 3 shows a block diagram of a further example prior art sample-hold-circuit embodied as a simple current mode sampler 20. The sampling device 20 comprises a switch 21, which is connected to a reset reference voltage at its input and to a sampling compositor 22 at its output. Moreover, the sampling device 20 comprises a sampling transistor 23 and a dump transistor 24. Also the sampling device 20 comprises a current source 25. The output of the switch 21 is connected to a first terminal of the sampling transistor 23. A second terminal of the sampling transistor 23 is connected to the current source 25. A first terminal of the dump transistor 24 is connected to HIGH potential, while a second terminal of the dump transistor 24 is also connected to the current source 25. Control terminals of the sampling transistor 23 and the dump transistor 24 are connected to a differential clock signal.

As the differential clock signal clkp-clkn starts moving towards positive values, more and more charge proportional to the input current will be steered though the sampling transistor Qs and towards the sampling capacitance 22. The voltage on the "out" terminal will drop, starting from a reset value resetRef, proportionally to the total charge steered and hence ultimately proportional to the input current during the entire steer time. The amount of drop from the reset value resetRef is the sampled value. For the rest of the time, when clkn is higher than clkp, the input current will be dumped through the dump transistor 24 to VCC. It should be noted that a reset circuit is also present which will erase the integrated charge between samples. At best, the reset time needs to be short and ending right before the integration period starts in order to increase the hold sampler time and reduce the hold reset time.

Figure 4:
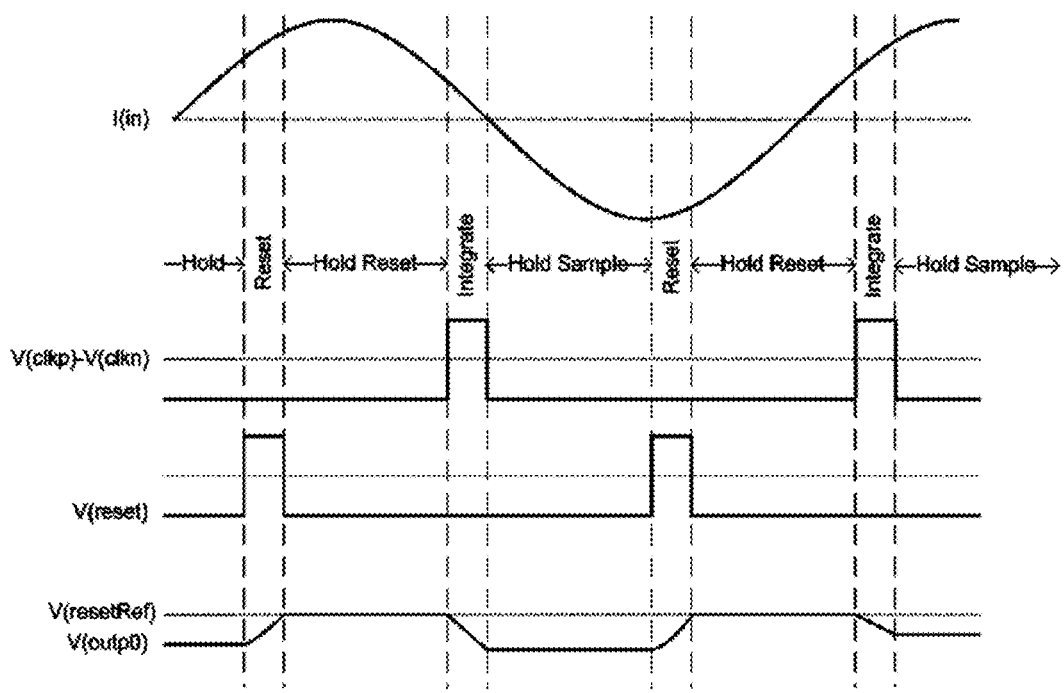
FIG. 4 shows signals of the sample-hold-circuit of FIG. 3.

FIG. 4 shows signals of the sample-hold-circuit of FIG. 3.

The main advantages of the current mode sampler originate from the fact that the input signal is a current quantity. The sampled value is the charge accumulated during the switch-on time, which is the time during which the sampling transistor 23 is conducting, and it is independent from the switch 21 on-resistance. The independence is true since the current signal generator has an infinite resistance or, if not ideal, a much higher impedance than the on-resistance of the switch 21. A direct favorable implication is that the sampling switch 21 on-resistance will not affect the sampling linearity.

Hence, the constraints on the clock signal transient shape, as in case of a track-and-hold sampler are removed. No special attention needs to be taken regarding the clock edges and clock pulse shape as long as they remain the constant. The only function of the clock signal is to allow the charge accumulated at the input node of the switch 21 to be passed on and integrated on the sampling capacitor 22. This means also that there are no non-ideal clock transition edges occupying part of the clock sampling period, since every part of the clock period is properly utilized. Ultimately, the switch resistance will only affect the speed at which the charge will be completely transferred to the sampling capacitance 22.

The clock pulse width will affect sampler bandwidth and gain. The smaller the clock pulse width, the higher the bandwidth and the smaller the gain are. This is related to the fact that the input current signal is integrated during the clock pulse width. As a rule of thumb, a sampler operating with a pulse width of TPW seconds will achieve a bandwidth of about 0.4/TPW Hz or a small variation of this value depending on the pulse shape. For example, a sampler operating with pulse widths of 10 ps will have a bandwidth of circa 40 GHz.

The sampler gain depends on the sampling capacitance value and on the clock pulse width. The higher the sampling capacitance, the smaller the gain is. The higher the pulse width, higher the gain. The pulse width is determined by the sampler bandwidth specification ultimately making the gain control dependent only from the sampling capacitance.

Figure 5:
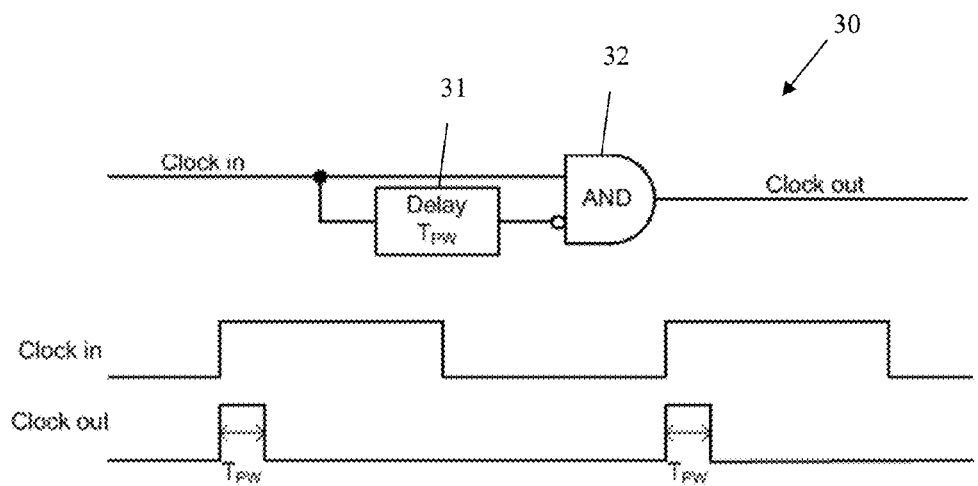
FIG. 5 shows a block diagram of an example prior art circuit for clock pulse generation and the resulting clock pulse signals.

Hence, while targeting a certain bandwidth for the sampler, the clock pulse width Tpw value is thereby determined. This value can be a small percentage of the clock period. Creating smaller clock pulses starting from, for example, a 50% clock duty cycle can be done by using the scheme in FIG. 5, which shows a block diagram of an example prior art circuit for clock pulse generation and the resulting clock pulse signals. The clock signal Clock in is delayed by a delay circuit 31 and simultaneously fed to an adder 32. The delayed clock signal and the non-delayed clock signal are added. The resulting clock pulse signal Clock out has a more defined pulse shape.

Figure 6:
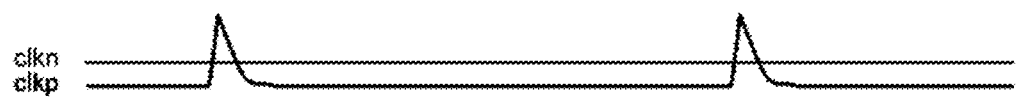
FIG. 6 shows an example prior art differential clock signal.

FIG. 6 shows an example prior art differential clock signal, consisting of a first partial signal clkn and a second partial signal clkp. In this example, the differential clock signal comprises two different partial signals clkn, clkp. While here, the first partial signal clkn is constant, only the second partial signal clkp comprises clock pulses. Alternatively, both signals can comprise pulses, which are directed into opposite directions.

Figure 7:
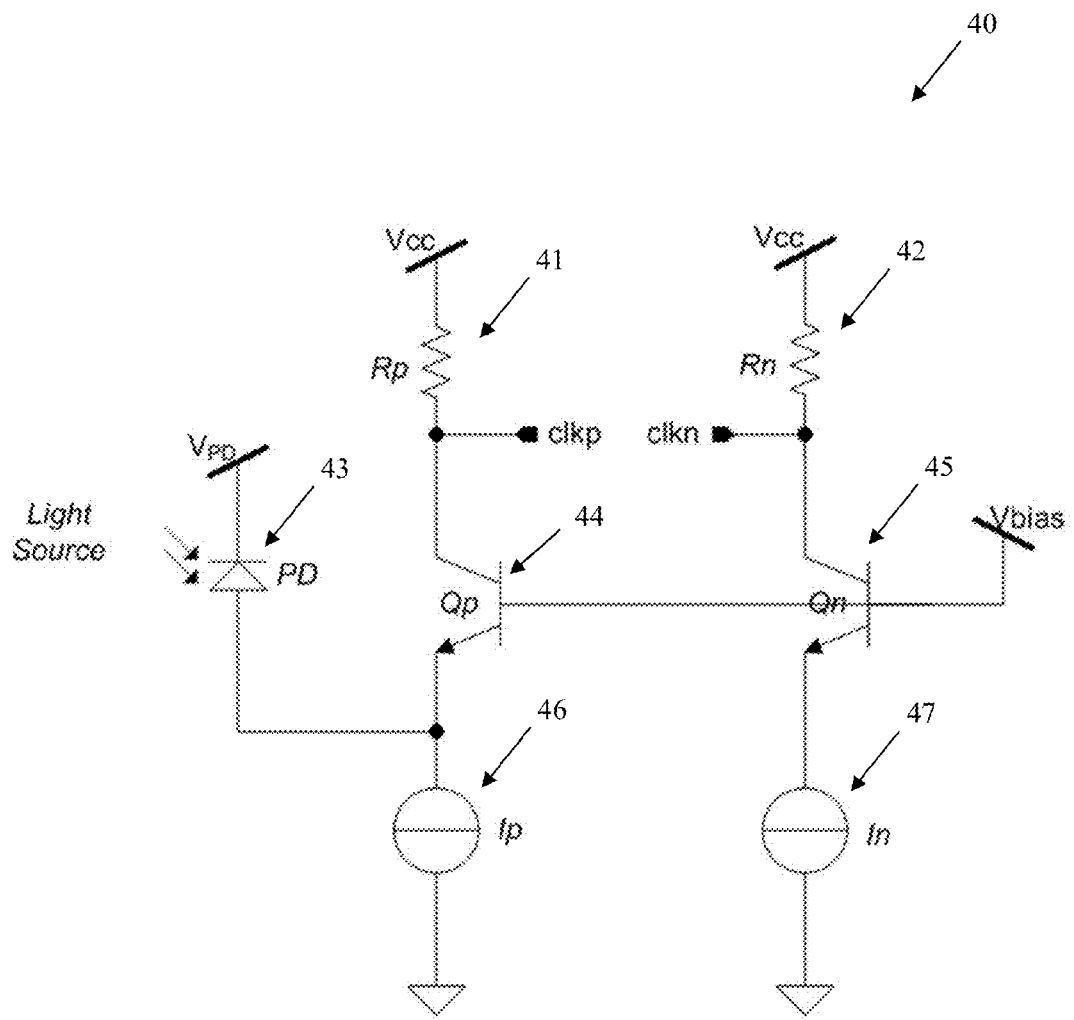
FIG. 7 shows a block diagram of an example prior art circuit for generating a differential clock signal from optical pulses.

Clock pulses can be also generated from of a photo diode (PD) driven by timely spaced optical pulses, such as the block diagram of the example circuit for generating a differential clock signal from optical pulses shown in FIG. 7. A clock generating circuit 40 comprises a first resistor 41, a second resistor 42, a first transistor 44, a second transistor 45, a first current source 46, a second current source 47 and a photodiode 43. The first resistor 41 and the second resistor 42 are both connected to HIGH potential with a first terminal, each. A second terminal of the resistors 41, 42 is each connected to a first terminal of one of the transistors 44, 45. Second terminals of the transistors 44, 45 are each connected to one of the current sources 46, 47. The second terminal of the first transistor 44 is connected to the photodiode 43. The first terminals of the transistors 44, 45 are connected to output terminals for outputting the differential clock signal.

The circuit 40 converts the photo diode current to a voltage. The PD current is controlled by a light source, for example, a LASER. Clkp signal depends on the voltage across the first resistor 41. The voltage across the first resistor 41 depends on the current flowing in the resistor 41. The current at the first resistor 41 is the difference between the Ip bias current provided by the first current source 46 and the PD current provided by the photo diode 43. Hence, the clkp signal depends on PD current provided by the photo diode 43. Clkn signal is constant. It depends on the value of the second resistor 42 and the In bias current provided by the second current source 47. Hence, the differential clock signal clkp-clkn is controlled by the PD current provided by the photo diode 43. In order to control the differential clock clkp-clkn zero crossing, the clkn signal level can be shifted by changing the In bias current level provided by the second current source 47.

Since the clock transition shape does not affect the linearity of the sampler, the voltage clock signal generated from the circuit above, as such directly at a sampler clock input, can be used without any further special signal conditioning which could degrade the clock phase stability performance. This is a great advantage for ultra-high clock noise performances.

Figure 8:
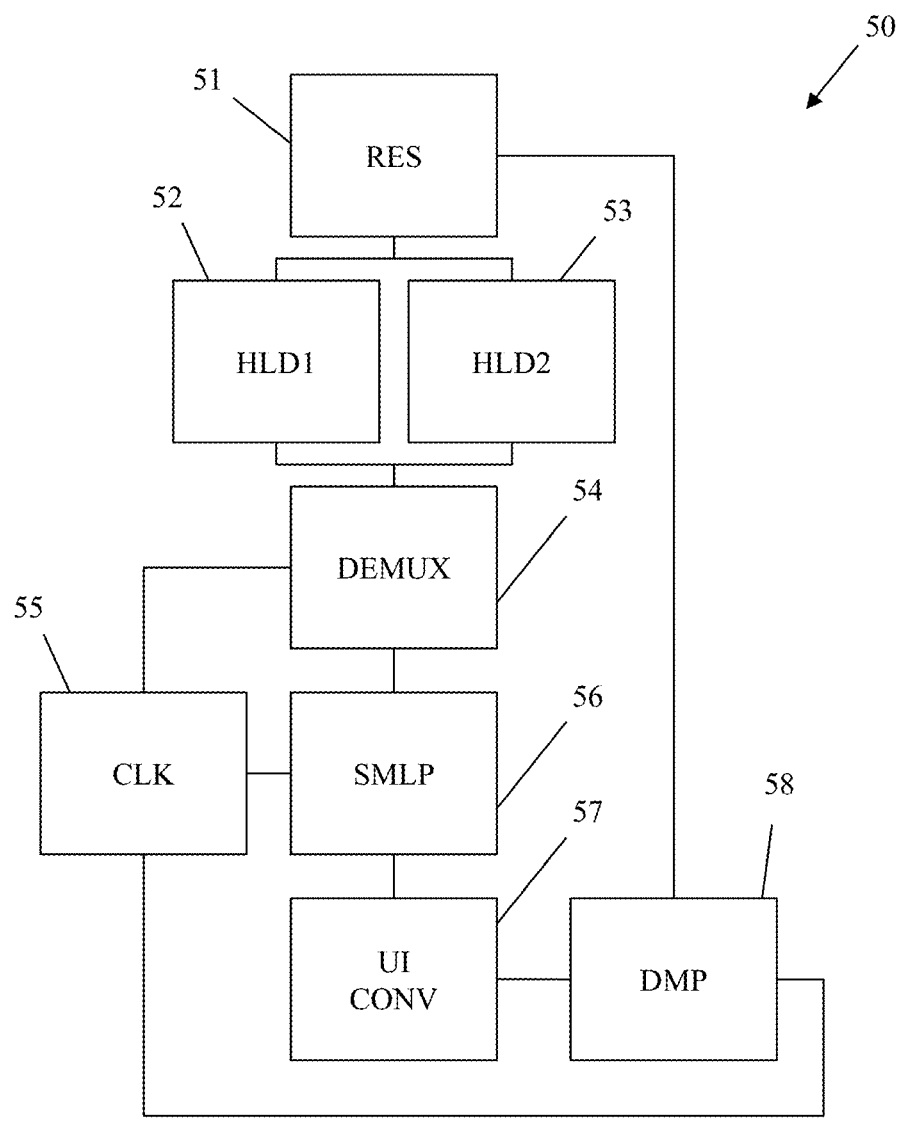
FIG. 8 shows a block diagram of a sampling device, in accordance with example embodiments.

FIG. 8 shows a block diagram of a sampling device, in accordance with example embodiments of the present invention. The sampling device of FIG. 8 performs the sample, hold and reset operations. The sampling device of FIG. 8 achieves significantly improved speeds while achieving significantly improved hold times, linearity and signal to noise performance at the sampler output.

With reference to FIG. 8, the sampling device 50 comprises a voltage-current-converter 57, which is connected to a sampling circuit 56, which is connected to a clock signal generator 55 and to a demultiplexing circuit 54. The demultiplexing circuit 54 is connected to a first holding device 52 and to a second holding device 53. The holding devices 52, 53 are connected to a reset device 51. The reset device 51 is connected to a dump circuit 58, which is also connected to the voltage-current-converter 57 and to the clock signal generator 55.

By way of example, the voltage-current-converter 57 converts a differential measuring voltage into a differential measuring current and hands it to the sampling circuit 56. The clock signal generator 55 generates a first clock signal and also hands it to the sampling circuit 56. The sampling circuit samples the differential measuring current during HIGH-pulses of the first clock signal and thereby generates a sampled differential signal comprising a differential signal sample for each pulse of the first clock signal and hands it to the demultiplexing circuit 54.

By way of further example, the clock signal generator 55 generates a second clock signal, which has half the clock rate of the first clock signal and hands it to the demultiplexing circuit 54. The demultiplexing circuit demultiplexer the sample differential signal and alternatingly hand samples to the first holding device 52 and the second holding device 53. The demultiplexing circuit 54 provides a differential sample of the sampled differential signal to the first holding device 52 at the occurrence of each HIGH-value of the second clock signal and provides a sample of the sampled differential signal to the second holding device 53 at the occurrence of each LOW-value of the second clock signal. The holding circuits 52, 53 hold the respective samples until they are reset by the reset circuit 51. The reset device 51 resets the first holding device at or after the occurrence of each LOW-value of the second clock signal and resets the second holding device at or after the occurrence of each HIGH-value of the second clock signal.

By way of further example, the dump circuit 58 dumps the measuring current during LOW-periods of the first clock signal. This means that the measuring current is not provided to the sampling circuit 56, but to the dump circuit 58 by the voltage-current-converter 57 during LOW-periods of the first clock signal. The second clock signal is not generated directly from the first clock signal by the clock signal generator 55 in order not to interfere with the highly accurate first clock signal. Instead, it is generated from a signal provided by the dump circuit 58. Moreover, the dump circuit 58 generates a first and a second reset signal, which are provided to the reset device 51 and initiate the reset of the first holding device 52 and the second holding device 53.

Figure 9:
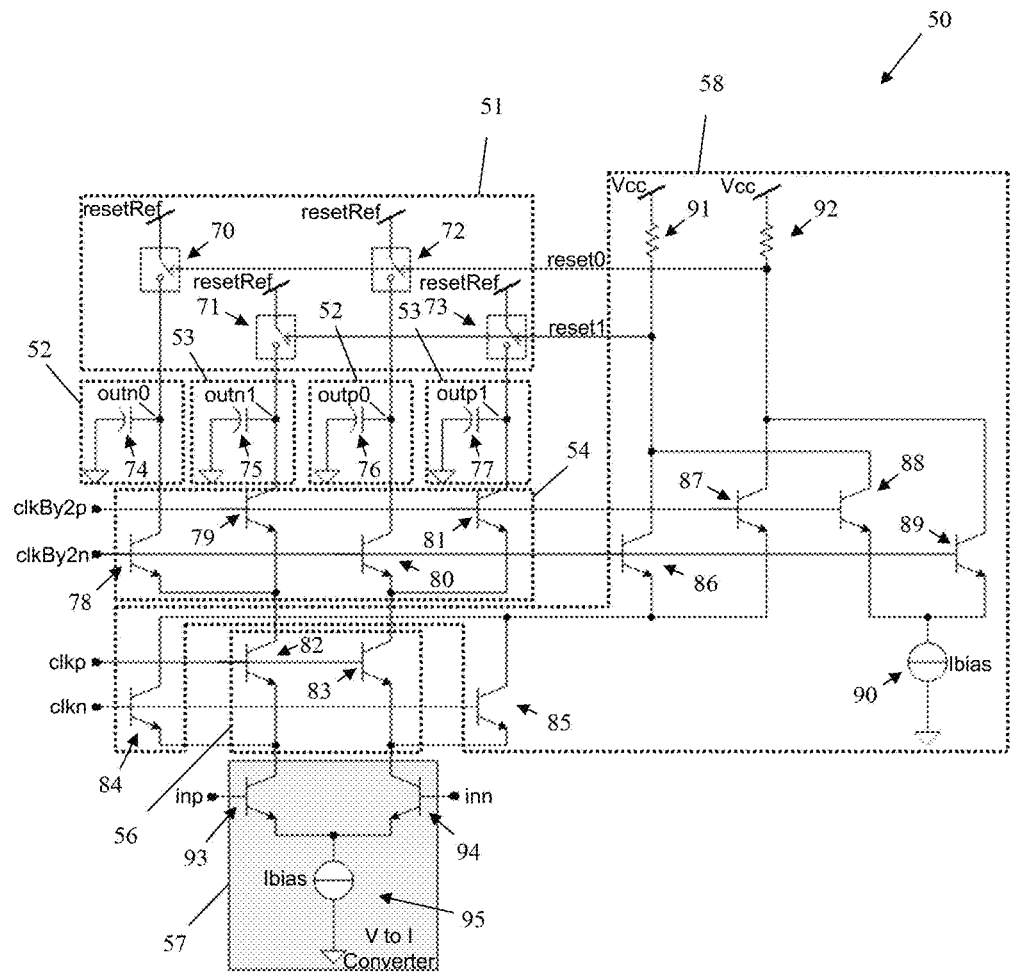
FIG. 9 shows a circuit diagram of a sampling device, in accordance with example embodiments.

FIG. 9 shows a circuit diagram of a sampling device, in accordance with example embodiments of the present invention. FIG. 9 illustrates an example of a more detailed view of the sampling device 50.

The voltage-current-converter 57 comprises a current source 95, which is connected to a first conversion transistor 93 and to a second conversion transistor 94. The differential measuring voltage inp/inn is connected to control inputs of the first conversion transistor and the second conversion transistor. Outputs of the first conversion transistor and the second conversion transistor provide a differential measuring current to the sampling circuit 56.

The sampling circuit 56 comprises a first sampling transistor 82 and a second sampling transistor 83, each connected to the voltage-current-converter 57 and to the demultiplexing circuit 54. The first sampling transistor 82 is connected to the first conversion transistor 93 and the second sampling transistor 83 is connected to the second conversion transistor 94. Control inputs of the first sampling transistor 82 and the second sampling transistor 83 are connected to a partial signal clkp of a first clock signal clkp/clkn. By way of example, the first sampling transistor 82 and the second sampling transistor 83 conduct the differential measuring current during HIGH-pulses of the first clock signal and not conduct the differential measuring current during LOW-pulses of the first clock signal, thereby generating a sampled differential signal.

The demultiplexing circuit 54 comprises a first demultiplexing path and a second demultiplexing path. By way of example, the first demultiplexing path provides the differential sample of the sampled differential signal to the first holding device 52, and the second multiplexing path provides the differential sample of the sampled differential signal to the second holding device 53 at the occurrence of each LOW-value of the second clock signal.

The first demultiplexing path comprises a first demultiplexing transistor 78 and a second demultiplexing transistor 80. The second multiplexing path comprises a third demultiplexing transistor 79 and a fourth demultiplexing transistor 81. A second clock signal clkby2p/clkby2n has half the clock rate of the first clock signal clkp/clkn. A first partial signal clkby2p of the second clock signal clkby2p/clkby2n is connected to the third demultiplexing transistor 79 and the fourth demultiplexing transistor 81. A second partial signal clkby2n of the second clock signal clkby2p/clkby2n is connected to the first multiplexing transistor 78 and the second multiplexing transistor 80. By way of example, the first multiplexing transistor 78 and the second demultiplexing transistor 80 provide the sampled differential signal to the first holding device 52 during each HIGH-value of the second clock signal. By way of further example, the third demultiplexing transistor 79 and the fourth demultiplexing transistor 81 provide the sampled differential signal to the second holding device 53 during each HIGH-value of the inverse second clock signal, which corresponds to each LOW-value of the second clock signal.

The first holding device 52 comprises a first holding capacitor 74 and a second holding capacitor 76. By way of example, the first and second holding capacitors 74, 76 store the partial differential signals of the sampled differential signal. The second holding device 53 comprises a third holding capacitor 75 and a fourth holding capacitor 77. By way of example, the third and fourth holding capacitors 75, 77 hold the partial differential signals of the differential sampled signal. By way of further example, after holding the respective signals for a holding period, during which a following supporting circuit (e.g., a digitizing circuit) can process the signals held by the first holding device 52 and second holding device 53, the respective holding devices 52, 53, their respective holding capacitors 74-77 are reset by the reset circuit 51. The reset circuit 51 comprises individual reset units 70, 71, 72 and 73, one for each holding capacitor 74-77. By way of example, the reset units 70-73 reset the respective holding capacitors 74-77 when they receive a reset signal reset 0, reset 1, which may be provided by the dump circuit 58. In other words, while one capacitor pair 74/76 or 75/77 is integrating the current signal, the other pair 75/77 or 74/76 is being reset to a determined value resetRef; and while one capacitor pair 74/76 or 75/77 is holding the sampled value, the other pair 75/77 or 74/76 is holding the reset value resetRef.

The dump circuit 58 comprises a first dump transistor 84 and a second dump transistor 85, which are connected to the voltage-current-converter 57, via the outputs of the conversion transistors 93, 94. The first dump transistor 84 is connected to the output of the first conversion transistor 93, and the second dump transistor 85 is connected to the output of the second conversion transistor 94. Control inputs of the first and second dump transistors 84, 85 are connected to the inverse of the first clock signal clkn. Outputs of the first and second dump transistors 84, 85 are combined to a dump path.

The dump circuit 58 further comprises a first resistor 91 and a second resistor 92, each connected to HIGH potential by a first terminal. The dump circuit 58 also comprises a first reset signal generating transistor 86 and a second reset signal generating transistor 87, which are connected between the dump path and one of the resistors 91, 92. The control input of the first reset signal generating transistor 86 is connected to the inverse of the second clock signal, while the control input of the second reset signal generating transistor 87 is connected to the second clock signal. By way of example, this is realized by connecting the first reset signal generating transistor 86 to the second partial signal clkby2n of the second clock signal and by connecting the second reset signal generating transistor 87 to the first partial signal clkby2p of the second clock signal. By way of further example, the outputs of the reset signal generating transistor 86, 87 generate the reset signals reset0, reset1, which are provided to the reset circuit 51.

The dump circuit further comprises a stabilizing current source 90, a first stabilizing transistor 88 and a second stabilizing transistor 89. The first stabilizing transistor 88 and the second stabilizing transistor 89 are both connected to the stabilizing current source 90. The first stabilizing transistor 88 is connected to the output of the first reset signal generating transistor 86. The output of the second stabilizing transistor 89 is connected to the output of the second reset signal generating transistor 87. The control input of the first stabilizing transistor 88 is connected to the first partial signal clkby2p of the second clock signal. The control input of the second stabilizing transistor 89 is connected to the second partial signal clkby2n of the second clock signal. By way of example, the first stabilizing transistor 88 keeps a voltage at the second terminal of the first resistor low, while a current flows through the second resistor 92, and the second stabilizing transistor 89 keeps a voltage at the second terminal of the second resistor 92 low, while a current flows through the first resistor 91.

By way of example, a current pulse from the collectors of the dump transistors 84, 85 is summed up. The resulting sum current is not modulated anymore from the input current signal. The sum current pulse is then demultiplexed by the transistors 86, 87 driven by the secondary clock on resistors 92, 91, thus generating the reset signals reset0, reset1 for each of the holding devices 52, 53. The differential stage formed by the transistors 88, 89 keeps the voltage on resistor R1 low when the dump current is steered on resistor R0 and vice versa, to keep the voltage on resistor R0 low when the dump current is steered on resistor R1. The bias current provided by the current source 90, used on the differential pair formed by the transistors 88, 89 is related to the maximum current in the dump path, which in this case is Ibias, such that the LOW level generated on resistors 91, 92 is the same, independently from the secondary clock state.

Figure 10:
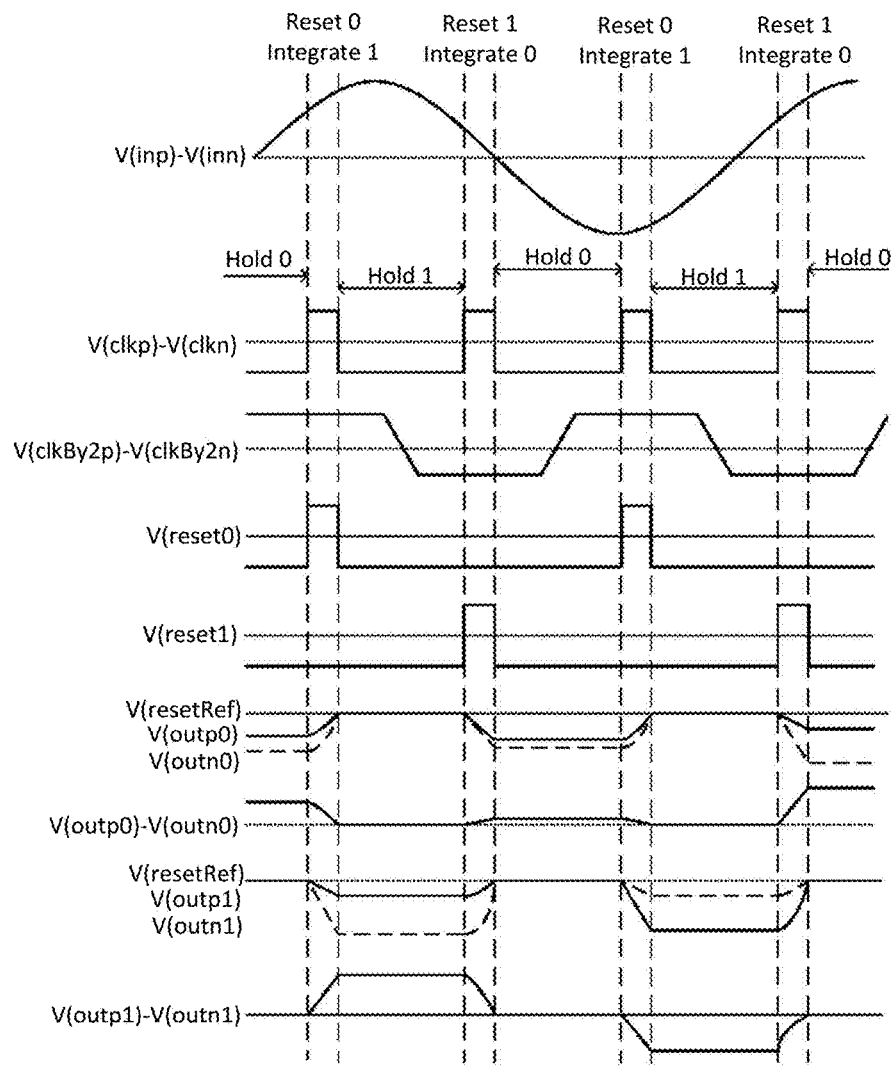
FIG. 10 shows signals of the sampling device of FIG. 9.

FIG. 10 shows signals of the sampling device of FIG. 9.

Figure 11:
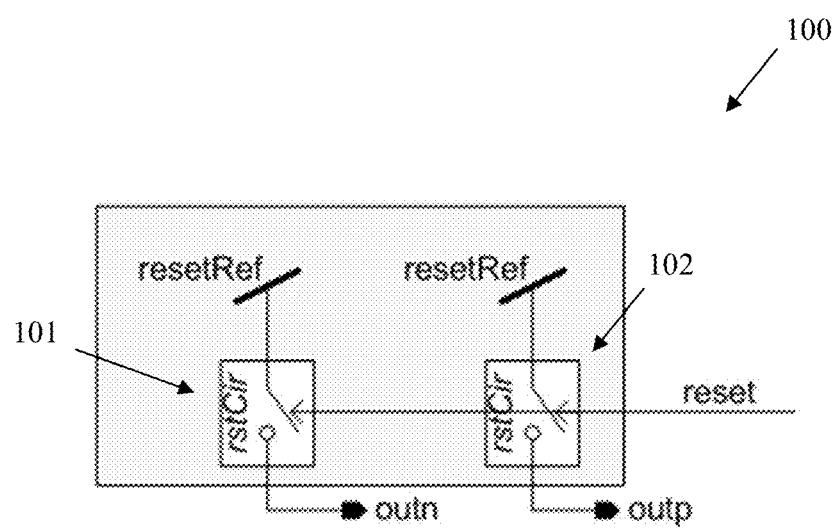
FIG. 11 shows an example block diagram of the reset-circuit of the sampling device of FIG. 9.

FIG. 11 shows an example block diagram 100 of the reset-circuit of the sampling device of FIG. 9, which comprises two reset units 101, 102. By way of example, the both reset units 101, 102 are configured to reset a single partial differential signal outn/outp based on a reset signal.

Figure 12:
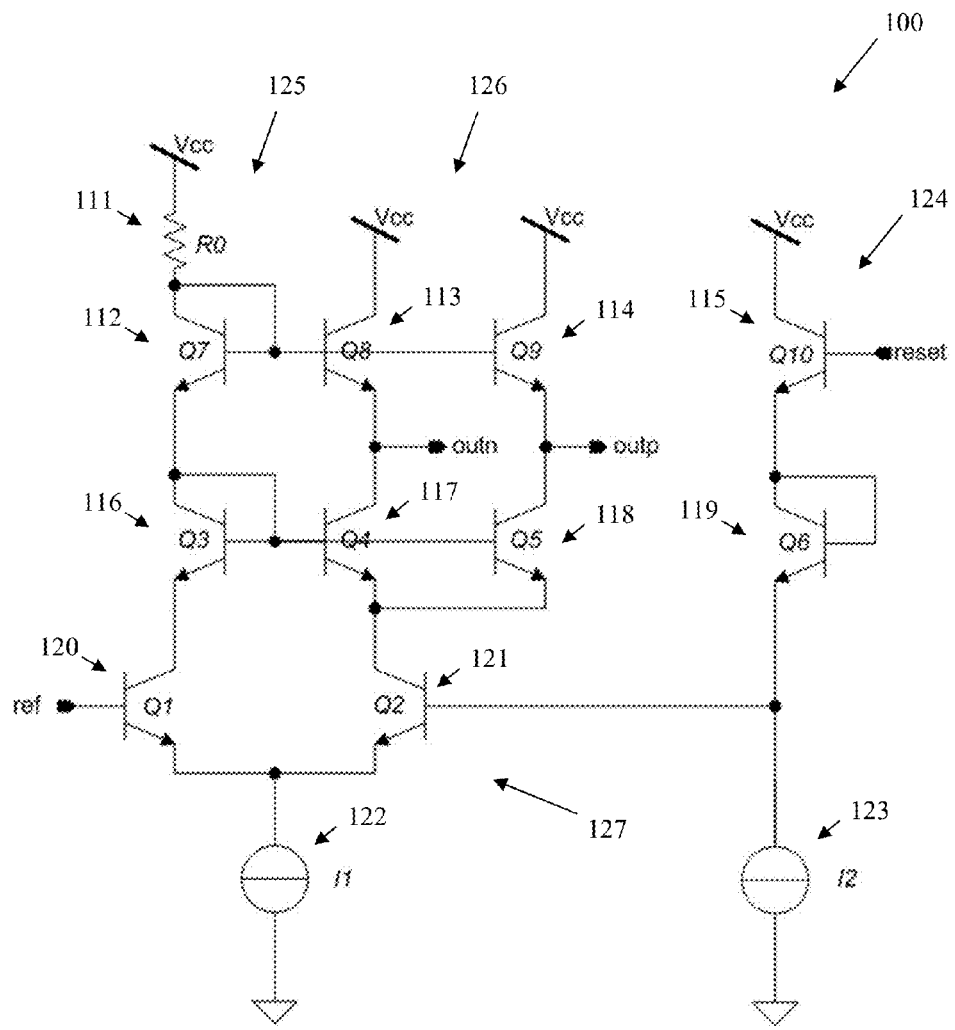
FIG. 12 shows an example circuit diagram of the reset circuit of FIG. 11.

FIG. 12 shows an example circuit diagram of the reset circuit 100 of FIG. 11. In FIG. 9, the reset circuit 51 comprises four reset units 70, 71, 72 and 73. The reset circuit 100 comprises an emitter following circuit 124, which is connected to the respective reset signal. By way of example, emitter following circuit 124 provides a voltage shifted first or second reset signal. The reset circuit 100 further comprises a dump path 125, which (for example) dumps a reset current, when activated. The reset circuit 100 further comprises a reset path 126, which (for example) provides a holding circuit reset signal to the respective first or second holding device, when activated. The reset circuit 100 further comprises a differential transistor pair 127, which (for example) activates the dump path while a LOW-value of the voltage shifted first or second reset signal is present and to activate the reset path while a HIGH-value of the respective voltage shifted first or second reset signal is present.

The emitter following circuit 124 comprises a first emitter following transistor 115, a second emitter following transistor 119 and an emitter following current source 123. The first emitter following transistor is connected to HIGH-potential at a first terminal and to a first terminal of the second emitter following transistor at a second terminal. The control input of the second emitter following transistor 119 is connected to the first terminal of the second emitter following transistor 119. A second terminal of the second emitter following transistor 119 is connected to the emitter following current source 123. A control input of the first emitter following transistor 115 is connected to the respective first or second reset signal. The second terminal of the second emitter following transistor 119 is configured to provide the voltage shifted first or second reset signal to the differential transistor pair 127.

The differential transistor pair 127 comprises a first differential pair transistor 120 and a second differential pair transistor 121. A first terminal of the first differential pair transistor 120 is connected to the dump path 125. A first terminal of the second differential pair transistor 121 is connected to the reset path 126. The reset circuit 100 further comprises a reset current source 122, which is connected to second terminals of the first differential pair transistor 120 and the second differential pair transistor 121. The control terminal of the first differential pair transistor 120 is connected to a holding circuit reset signal ref while the control terminal of the second differential pair transistor 121 is connected to the output of the emitter following circuit 124—the voltage shifted first or second reset signal. By way of example, the first differential pair transistor 120 conducts the reset current, and thereby dump the reset current to the dump path 125, while a LOW-value of the voltage shifted first or second reset signal is present at the control terminal of the second differential pair transistor 121. By way of further example, the second differential pair transistor 121 conducts the reset current and thereby activated the reset path 126 to provide a holding current reset signal ref to the respective first or second holding device, while a HIGH-value of the voltage shifted first or second reset signal is present at the control terminal of the second differential pair transistor 121.

The dump path 125 comprises a dump path resistor 111, a first dump path transistor 112 and a second dump path transistor 116, which are connected in series. The dump path resistor 111 is connected to HIGH-potential at a first terminal and to a first terminal of the first dump path transistor 112 and a control input of the first dump path transistor 112, at a second terminal. A second terminal of the first dump path transistor 112 is connected to a first terminal of the second dump path transistor 116 and to a control input of the second dump path transistor 116. A second terminal of the second dump path transistor 116 is connected to the differential transistor pair 127, for example, to the first differential pair transistor 120. By way of example, the first dump path transistor 112 and the second dump path transistor 116 conduct to the reset current, while the dump path 125 is activated.

The reset path 126 comprises a first reset transistor 113, a second reset transistor 114, a third reset transistor 117 and a fourth reset transistor 118. The first terminals of the first reset transistor 113 and the second reset transistor 114 are connected to HIGH-potential. Control inputs of the first reset transistor 113 and the second reset transistor 114 are connected to the control input of the first dump path transistor 112. A second terminal of the first reset transistor 113 is connected to a first terminal of the third reset transistor 117. A second terminal of the second reset transistor 114 is connected to a first terminal of the fourth reset transistor 118. Control inputs of the third reset transistor 117 and the fourth reset transistor 118 are connected to the control input of the second dump path transistor 116. Second terminals of the third reset transistor and the fourth reset transistor are connected to the differential transistor pair 127, for example, to the second differential pair transistor 121. By way of example, the first reset transistor 113, the second reset transistor 114, the third reset transistor 117 and the fourth reset transistor 118 conduct the reset current and thereby provide the holding circuit reset signal ref to the respective first or second holding device, while the reset path 126 is activated. Thereby, the holding circuit reset signal ref is provided as differential signal outn/outp to the respective holding circuit which is thereby reset.

By way of example, the holding circuit reset signal ref at the control input of the transistor 120 is set in such a way that when a reset signal is HIGH at the control input of transistor 115, the reset current 11 will flow almost completely through transistor 121. Vice versa, when the reset signal is LOW at the control input of transistor 115, the reset current 11 will flow almost completely all through transistor 120. During reset, the reset current 11 flows in transistor 121, and is split in two by equal dimensioned transistors 117, 118. Transistors 113, 114 receive the current from transistors 117, 118 and start pulling the sampling capacitors connected on outp and outn towards reset value resetRef. The resetRef value is the VCC minus the Vbe voltage generated on the equal dimensioned transistors 113, 114 while they become conductive. During reset, the bases of 117, 118, 113, 114, are pulled HIGH since no current is flowing in the branch 116, 112, 111. After the reset is over, the reset current 11 flows through the dump path 125 and the base voltages of transistors 117, 118, 113, 114 are all pulled LOW. As a result, the parallel resistance of the emitter of transistor 113 and the collector of transistor 117 becomes HIGH, thus ending the reset of the sampling capacitors. The same is true for the parallel resistance of the emitter of transistor 113 and the collector of transistor 118.

Figure 13:
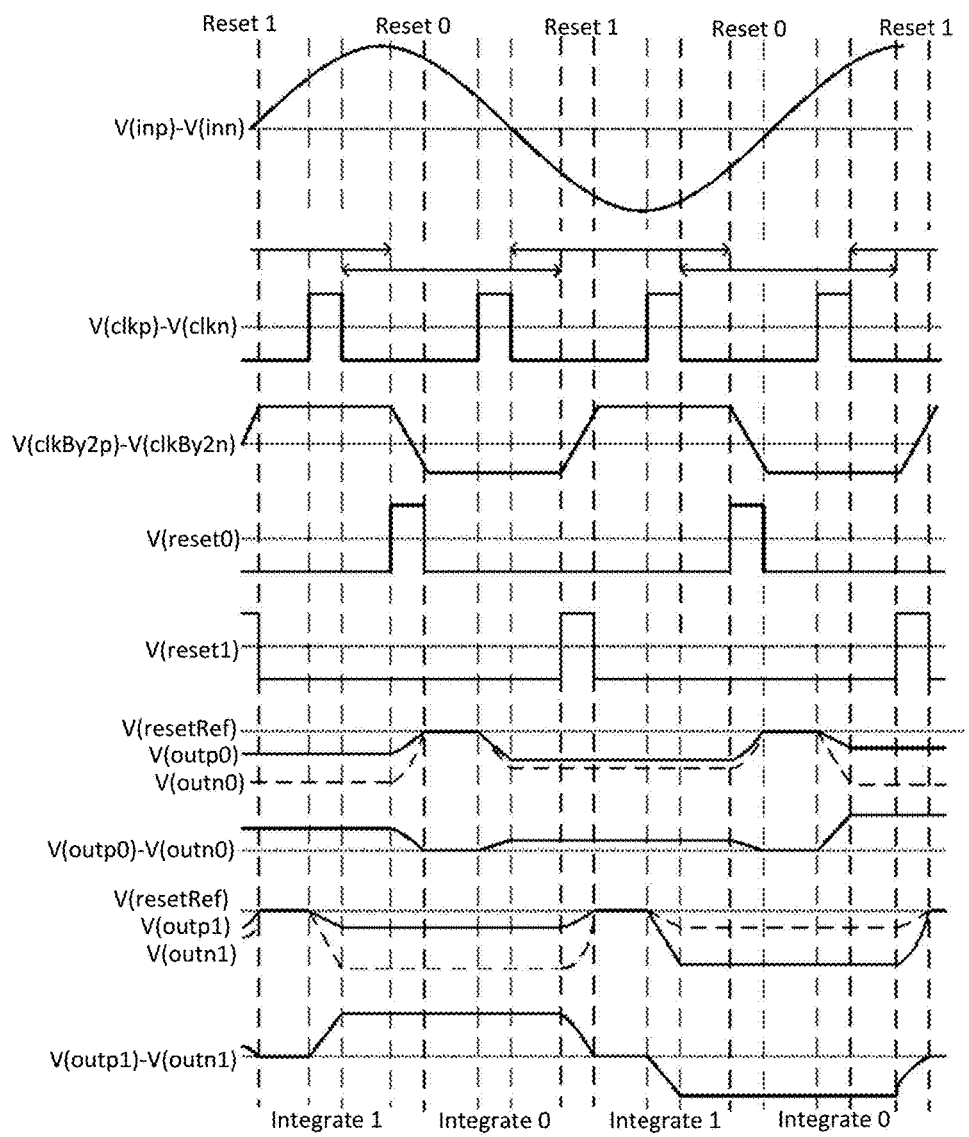
FIG. 13 shows signals of the circuits of FIGS. 9, 11 and 12.

It should be noted that that there is some delay from the moment the measuring current is steered to the dump circuit 58 to the moment the reset event arrives at the reset device. This delay though is advantageous, since this delay extends the sample hold period and reduces the reset hold period. FIG. 13 shows signals of the circuits of FIGS. 9, 11 and 12.

By way of further example, due the inherent reset signal path circuit delay the hold times are increased and overlapping each other, and the delay can be adjusted to maximize the hold time, thus bringing the reset hold time close to zeros.

By way of further example, the secondary clock may be approximately a 50% duty cycle signal, and running at half the rate of the main clock, where its phase relation with respect to the main clock is such that the secondary clock is in a stable state during the main clock pulses—or, in other words, signal transitions on main clock and secondary clock do not overlap in time.

By way of further example, the secondary clock does not have a tight jitter specification—a high level of jitter compared to the main clock is tolerable in the secondary clock, since it cannot affect the amount of charge sampled—its primary role is to demultiplex the charge arriving from the main switch. Timing precision is only required on the main clock.

By way of further example, the secondary clock can be generated from a clock by 2 clock divider circuit with has, as in input signal, the main clock. That means, loading the main clock with a divide by 2 circuit. This though would be disadvantageous, since a loading of the main clock would occur, leading to a degrading of the main clock performance and therefore to the overall accuracy of the sampling device.

Figure 14:
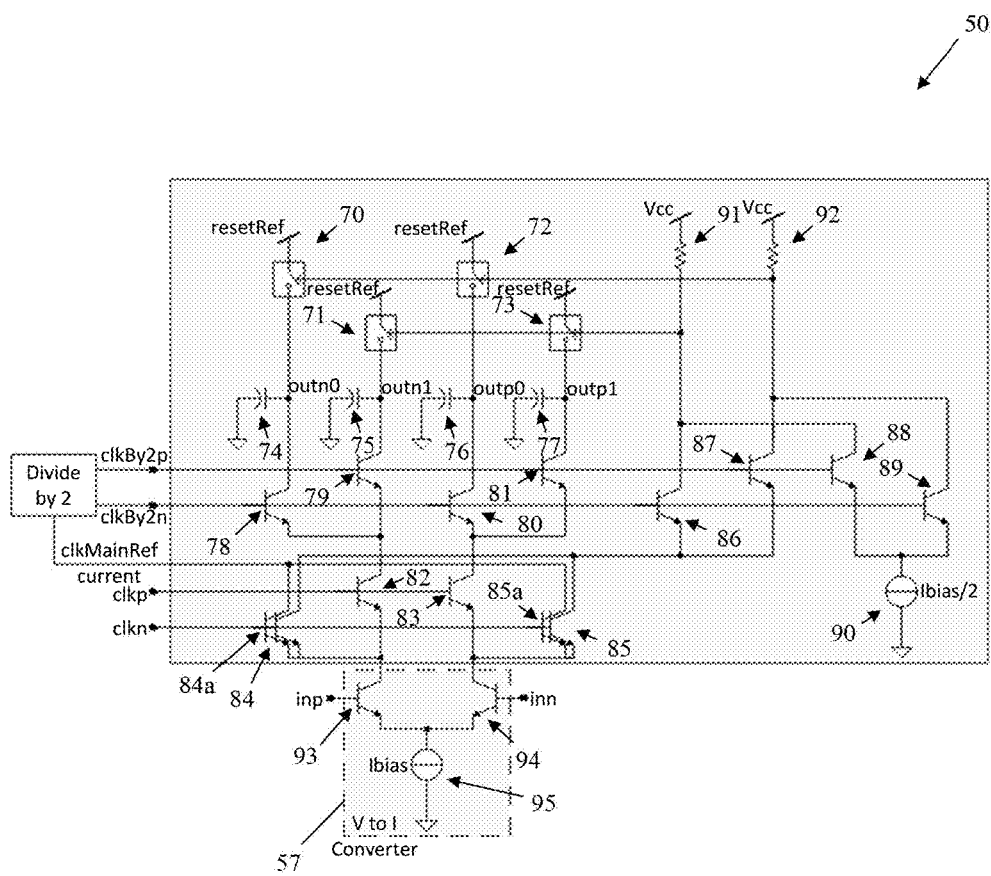
FIG. 14 shows a circuit diagram of a further sampling device, in accordance with example embodiments.

FIG. 14 shows a circuit diagram of a further sampling device, in accordance with example embodiments of the present invention. The sampling circuit 50 of FIG. 14 addresses the above-mentioned problem of a loading of the main clock leading to a degrading of the main clock performance and therefore to the overall accuracy of the sampling device. With reference to FIG. 14, only differences with regard to FIG. 9 are described in detail.

Loading of the main clock is avoided in order to minimize or eliminate any effect on the timing precision. In order to generate the second clock signal, the current pulse in the dump circuit is used as a main clock reference signal. Part of the current sum from the collectors of the transistors 84, 85 is used to generate a main clock. By way of example, by splitting the transistors 84, 85, each into two transistors 84, 84a, 85, 85a, part of the dump current signal can be used for the reset signal generation as already described above and part of it as an input signal for a divide by two block. The output signal of the divide by two block is the secondary clock.

Figure 15:
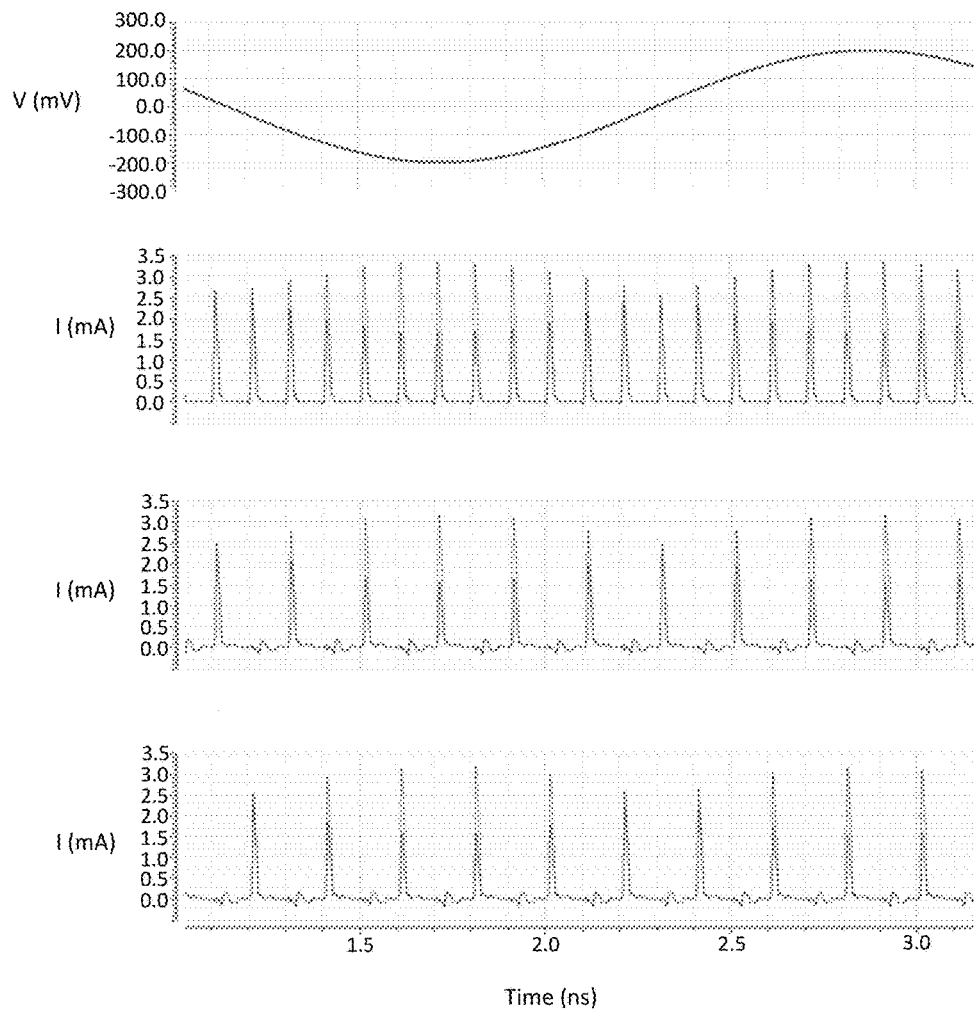
FIG. 15 shows measuring results of sampling devices, in accordance with example embodiments.

FIG. 15 shows measuring results of sampling devices, in accordance with example embodiments of the present invention, where signals at different positions within the sampling device are depicted. The top most signal is the measuring voltage. The second signal shows the voltage at the sampling transistors 82, 83. The third signal shows the voltage at the multiplexing transistors 78, 80. The fourth signal shows the voltage at the demultiplexing transistors 79, 81.

The invention is not limited to the examples described above, and is not limited to the use of the inventive sampling device in an analog-digital converter. A multitude of possible applications is foreseeable. Also, all employed transistors may be bipolar transistors, or field effect transistors of any other transistor technology. The characteristics of the example embodiments can be used in any advantageous combination.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A device for sampling a differential measuring voltage, comprising:
   a first holding device and a second holding device;
   a sampling transistor circuit configured to sample the differential measuring voltage based on pulses of a first clock signal to generate a sampled differential signal, wherein the sampled differential signal comprises a differential signal sample for each pulse of the first clock signal;
   a demultiplexer circuit configured to provide a first subset of the differential signal samples to the first holding device, wherein each of the first subset of the differential signal samples is provided to the first holding device at a respective pulse of a second clock signal at a first level, the second clock signal being at a second clock rate of approximately half of a first clock rate of the first clock signal; and
   a reset circuit configured to reset the second holding device at or after each first level pulse of the second clock signal.

2. The device according to claim 1, wherein the sampling device comprises a voltage-current-converter configured to convert the differential measuring voltage into a differential measuring current.

3. The device according to claim 2, wherein the sampling transistor circuit is configured to sample the differential measuring current based on the pulses the first clock signal, thereby generating the differential signal sample for each pulse of the first clock signal.

4. The device according to claim 3, wherein the voltage-current-converter comprises:
   a current source;
   a first conversion transistor connected to the current source; and
   a second conversion transistor connected to the current source; and
   wherein the differential measuring voltage is connected to control inputs of the first conversion transistor and the second conversion transistor, and wherein the first conversion transistor and the second conversion transistor are configured to provide the differential measuring current to the sampling transistor circuit.

5. The device according to claim 4, wherein the sampling transistor circuit comprises:
a first sampling transistor and a second sampling transistor, each connected to the voltage-current-converter and to the demultiplexing circuit; and
wherein control inputs of the first sampling transistor and the second sampling transistor are connected to the first clock signal, and
wherein the first sampling transistor and the second sampling transistor are configured to conduct the differential measuring current at pulses of the first clock signal at a first level, and to not conduct the differential measuring current at pulses of the first clock signal at a second level, thereby generating the sampled differential signal.

6. The device according to claim 3, wherein each pulse of the first clock signal is at a one of two different levels, and wherein the sampling device further comprises a dump circuit, and wherein the sampling transistor circuit is configured to dump the differential measuring current to the dump circuit at each of the pulses of the first clock signal that is at a same one of the two levels.

7. The device according to claim 6, wherein the dump circuit is configured to provide a first reset signal to the reset device to trigger the reset of the first holding device, and to provide a second reset signal to the reset device to trigger the reset of the second holding device.

8. The device according to claim 7, wherein the dump circuit is configured to provide the first reset signal to the reset device with a first delay with respect to a triggering clock pulse, and to provide the second reset signal to the reset device with a second delay with respect to the triggering clock pulse.

9. The device according to claim 6, wherein the dump circuit comprises:
a first dump transistor and a second dump transistor, connected to the sampling transistor circuit, configured to receive the differential measuring current at the pulses of the first clock signal that are at a same one of the two levels, wherein outputs of the first dump transistor and the second dump transistor are combined to a dump path;
a first resistor and a second resistor, each connected at a respective first terminal to a first potential;
a first reset signal transistor with a first terminal connected to the dump path and with a second terminal connected to a second terminal of the first resistor; and
a second reset signal transistor with a first terminal connected to the dump path and with a second terminal connected to a second terminal of the second resistor; and
wherein a second terminal of the first resistor is connected to the reset device and is configured to provide a first reset signal to the reset device, and wherein a second terminal of the second resistor is connected to the reset device and is configured to provide a second reset signal to the reset device.

10. The device according to claim 9, wherein:
the sampling device further comprises a clock signal generator configured to generate the first clock signal and the second clock signal;

the dump circuit comprises a third dump transistor connected in parallel to the first dump transistor and a fourth dump transistor connected in parallel to the second dump transistor;
output signals of the third dump transistor and the fourth dump transistor are combined to a clock generating signal;
the clock generating signal is provided to the clock signal generator; and
the clock signal generator is configured to generate the second clock signal based on the clock generating signal.

11. The device according to claim 9, wherein the dump circuit comprises:
a stabilizing current source;
a first stabilizing transistor, connected between the stabilizing current source and the second terminal of the first resistor, configured to maintain a voltage at the second terminal of the first resistor at a second potential while a current flows through the second resistor; and
a second stabilizing transistor, connected between the stabilizing current source and the second terminal of the second resistor, configured to maintain a voltage at the second terminal of the second resistor at the second potential while a current flows through the first resistor.

12. The device according to claim 1, wherein the demultiplexing circuit is configured to provide a second subset of the differential signal samples to the second holding device, wherein each of the second subset of the differential signal samples is provided to the second holding device at a respective pulse of the second clock signal at a second level, and the reset device is configured to reset the first holding device at or after each second level pulse of the second clock signal.

13. The device according to claim 12, wherein the demultiplexing circuit comprises:
a first demultiplexing path configured to provide each of the first subset of the differential signal samples to the first holding device at the respective first level pulse of the second clock signal, and
a second demultiplexing path configured to provide each of the second subset of the differential signal samples to the second holding device at the respective second level pulse of the second clock signal.

14. The device according to claim 13, wherein:
the first demultiplexing path comprises a first demultiplexing transistor and a second demultiplexing transistor, connected to the sampling transistor circuit and to the first holding device;
the second demultiplexing path comprises a third demultiplexing transistor and a fourth demultiplexing transistor, connected to the sampling transistor circuit and to the second holding device;
the second clock signal is connected to control inputs of the first demultiplexing transistor and the second demultiplexing transistor;
an inverse of the second clock signal is connected to control inputs of the third demultiplexing transistor and the fourth demultiplexing transistor;
the first demultiplexing transistor and the second demultiplexing transistor are configured to provide each of the first subset of the differential signal samples to the first holding device at the respective first level pulse of the second clock signal; and
the third demultiplexing transistor and the fourth demultiplexing transistor are configured to provide each of the first subset of the differential signal samples to the second holding device at pulses of the inverse of the second clock signal at a first level, each of which corresponding to a respective second level pulse of the second clock signal.

15. The device according to claim 12, wherein:
the first holding device comprises a first holding capacitor and a second holding capacitor configured to store the differential signal samples of the first subset sampled differential signal; and
the second holding device comprises a third holding capacitor and a fourth holding capacitor configured to store the differential signal samples of the second subset.

16. The device according to claim 12, wherein the reset device comprises:
a first reset circuit configured to reset the first holding device in response to receipt of a first reset signal; and
a second reset circuit configured to reset the second holding device in response to receipt of a second reset signal.

17. The device according to claim 16, wherein each of the first reset circuit and the second reset circuit (the first reset circuit with respect to the first holding device and the first reset signal, and the second reset circuit with respect to the second holding device and the second reset signal) comprises:
an emitter following circuit, connected to the respective reset signal, configured to provide a voltage shifted version of the respective reset signal at one of a first level and a second level;
a dump path configured to dump a reset current when activated;
a reset path configured to provide the respective reset signal to the respective holding device when activated; and
a differential transistor pair configured to activate the dump path in response to receipt of the respective voltage shifted reset signal at the second level, and to activate the reset path in response to receipt of the respective voltage shifted reset signal at the first level.

18. The device according to claim 17, wherein, for each of the first reset circuit and the second reset circuit, the emitter following circuit comprises:
a first emitter following transistor, a second emitter following transistor, and an emitter following current source; and
wherein a first terminal of the first emitter following transistor is connected to a first potential, and a second terminal of the first emitter following transistor is connected to a first terminal of the second emitter following transistor,
wherein a control input of the second emitter following transistor is connected to the first terminal of the second emitter following transistor,
wherein a second terminal of the second emitter following transistor is connected to the emitter following current source,
wherein a control input of the first emitter following transistor is connected to the respective first or second reset signal, and
wherein the second terminal of the second emitter following transistor is configured to provide the respective voltage shifted first or second reset signal.

19. The device according to claim 17, wherein each of the first reset circuit and the second reset circuit comprises a reset current source, and wherein, for each of the first reset circuit and the second reset circuit:

the differential transistor pair comprises a first differential pair transistor and a second differential pair transistor, wherein a first terminal of the first differential pair transistor is connected to the dump path, and wherein a first terminal of the second differential pair transistor is connected to the reset path; and
the reset current source is connected to a second terminal of each of the first differential pair transistor and the second differential pair transistor, and is configured to provide a reset current;
a control terminal of the first differential pair transistor is connected to a holding circuit reset signal;
a control terminal of the second differential pair transistor is connected to the respective voltage shifted first or second reset signal;
the first differential pair transistor is configured to conduct the reset current, and thereby provide the reset current to the dump path, in response to receipt of the respective voltage shifted first or second reset signal at the second value at the control terminal of the second differential pair transistor; and
the second differential pair transistor is configured to conduct the reset current, and thereby activate the reset path to provide the respective first or second reset signal to the respective first or second holding device, in response to receipt of the respective voltage shifted first or second reset signal at the first value at the control terminal of the second differential pair transistor.

20. The device according to claim 17, wherein, for each of the first reset circuit and the second reset circuit, the dump path comprises:
a dump path resistor, a first dump path transistor, and a second dump path transistor; and
wherein a first terminal of the dump path resistor is connected to the first potential, and a second terminal of the dump path resistor is connected to a first terminal of the first dump path transistor and to a control input of the first dump path transistor,
wherein a second terminal of the first dump path transistor is connected to a first terminal of the second dump path transistor and to a control input of the second dump path transistor,
wherein a second terminal of the second dump path transistor is connected to the differential transistor pair,
wherein the first dump path transistor and the second dump path transistor are configured to conduct the reset current, while the dump path is activated,
wherein the reset path comprises a first reset transistor, a second reset transistor, a third reset transistor, and a fourth reset transistor,
wherein a first terminal of each of the first reset transistor and the second reset transistor is connected to the first potential,
wherein a control input of each of the first reset transistor and the second reset transistor is connected to the control input of the first dump path transistor,
wherein a second terminal of the first reset transistor is connected to a first terminal of the third reset transistor,
wherein a second terminal of the second reset transistor is connected to a first terminal of the fourth reset transistor,
wherein a control input of each of the third reset transistor and the fourth reset transistor is connected to the control input of the second dump path transistor, wherein a second terminal of each of the third reset transistor and the fourth reset transistor is connected to the differential transistor pair, and wherein the first reset transistor, the second reset transistor, the third reset transistor, and the fourth reset transistor are configured to conduct the reset current and thereby provide the respective first or second reset signal to the respective first or second holding device, while the reset path is activated.

* * * * *